US012770845B2

(12) United States Patent
Sakai et al.

(10) Patent No.: US 12,770,845 B2
(45) Date of Patent: Oct. 20, 2026

(54) TEMPERATURE CONTROL SYSTEM AND PLASMA PROCESSING SYSTEM

(71) Applicant: Tokyo Electron Limited, Tokyo (JP)

(72) Inventors: Hayato Sakai, Miyagi (JP); Kazuhiro Chiba, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 43 days.

(21) Appl. No.: 19/058,027

(22) Filed: Feb. 20, 2025

(65) Prior Publication Data

US 2025/0191899 A1 Jun. 12, 2025

Related U.S. Application Data

(63) Continuation of application No. PCT/JP2023/030155, filed on Aug. 22, 2023.

(Continued)

(51) Int. Cl.
*H01J 37/32* (2006.01)

(52) U.S. Cl.
CPC .................. *H01J 37/32954* (2013.01); *H01J 37/32091* (2013.01); *H01J 2237/002* (2013.01)

(58) Field of Classification Search
CPC ............. H10P 72/0602; H10P 72/0434; H10P 72/0421; H01L 21/6831; H01L 21/67109;

(Continued)

(56) References Cited

U.S. PATENT DOCUMENTS

2023/0069582 A1* 3/2023 Fang .................. H10P 72/0602
2023/0147288 A1* 5/2023 Mimura ................ G05B 11/42 700/42

(Continued)

FOREIGN PATENT DOCUMENTS

JP H06-346256 A 12/1994
JP 2001-044176 A 2/2001

(Continued)

OTHER PUBLICATIONS

International Search Report and Written Opinion mailed on Oct. 3, 2023, received for International Application No. PCT/JP2023/030155, filed on Aug. 22, 2023, 8 pages including English Translation.

*Primary Examiner* — Renan Luque
(74) *Attorney, Agent, or Firm* — XSENSUS LLP

(57) ABSTRACT

The disclosed temperature control system includes a first segment, a second segment, and a connector. The first segment includes a first temperature control circuit and a first case accommodating the first temperature control circuit therein, the first temperature control circuit including a first heat exchanger for exchanging heat with a first temperature-controlled medium. The second segment includes a first tank and a first pump in a first circulation system for circulating the first temperature-controlled medium through a first flow path in a first member of a plasma processing apparatus and includes a second case accommodating the first tank and the first pump therein. The connector is a part of the first circulation system, is disposed between the first segment and the second segment, and is connected between the first pump and the first heat exchanger.

20 Claims, 7 Drawing Sheets

Related U.S. Application Data

(60) Provisional application No. 63/403,119, filed on Sep. 1, 2022.

(58) Field of Classification Search
CPC ........... H01J 37/32798; H01J 37/32724; H01J 37/32532; H01J 37/32522; H01J 37/32431; H01J 37/32091; H01J 37/32009; H01J 37/20; H01J 2237/334; H01J 2237/2001; H01J 37/32954; H01J 2237/002; F28D 1/0213; H05H 1/46; F25B 30/02; F25B 39/02; F25B 39/04
See application file for complete search history.

(56) References Cited

U.S. PATENT DOCUMENTS

| | | | | |
|---|---|---|---|---|
| 2024/0071732 | A1* | 2/2024 | Hwang | H01J 37/32449 |
| 2025/0258508 | A1* | 8/2025 | Takayama | F16K 11/0853 |

FOREIGN PATENT DOCUMENTS

| | | | |
|---|---|---|---|
| JP | 2005-175460 | A | 6/2005 |
| JP | 2006-269944 | A | 10/2006 |
| JP | 2014-127534 | A | 7/2014 |
| JP | 2016-081158 | A | 5/2016 |
| JP | 2020-190494 | A | 11/2020 |

* cited by examiner

TEMPERATURE CONTROL SYSTEM AND PLASMA PROCESSING SYSTEM

CROSS-REFERENCE TO RELATED APPLICATIONS

This application is a bypass continuation application of international application No. PCT/JP2023/030155 having an international filing date of Aug. 22, 2023 and designating the United States, the international application being based upon and claiming the benefit of priority from U.S. Application No. 63/403,119, filed on Sep. 1, 2022, the entire contents of each are incorporated herein by reference.

TECHNICAL FIELD

Exemplary embodiments of the present disclosure relate to a temperature control system and a plasma processing system.

BACKGROUND

JP2001-44176A described below describes a plasma processing apparatus in which a temperature-controlled medium is circulated by a chiller unit through a flow path in a substrate support that supports a substrate to control a temperature of the substrate.

CITATION LIST

Patent Documents

PTL 1: JP2001-44176A

SUMMARY

The disclosure provides a technique for reducing a size of a unit forming a temperature control system in a plasma processing system.

According to one or more embodiments of the present application, a temperature control system is provided. The temperature control system includes a first segment, a second segment, and a connector. The first segment includes a first temperature control circuit and a first case. The first temperature control circuit includes a first heat exchanger configured to exchange heat with a first temperature-controlled medium. The first case accommodates the first temperature control circuit therein. The second segment includes a first tank, a first pump, and a second case. The first tank and the first pump are provided in a first circulation system configured to circulate the first temperature-controlled medium through a first flow path in a first member of the plasma processing apparatus. The second case accommodates the first tank and the first pump therein. In the first circulation system, the first tank is connected between the first flow path and the first pump, and the first heat exchanger is connected between the first pump and the first flow path. The connector is a part of the first circulation system, is disposed between the first segment and the second segment, and is connected between the first pump and the heat exchanger.

According to one or more embodiments of the present application, a technique for reducing a size of a unit forming a temperature control system in a plasma processing system is provided.

DETAILED DESCRIPTION

Figure 1:
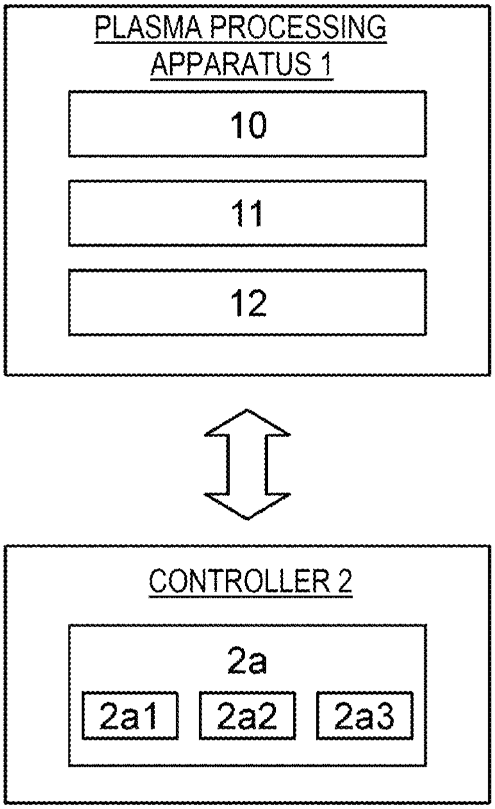
FIG. 1 is a diagram illustrating an example of a configuration of a plasma processing system according to one or more embodiments of the present application.

Hereinafter, various exemplary embodiments, that are usable together, will be described in detail with reference to the drawings. Further, like reference numerals will be given to like or corresponding parts throughout the drawings.

FIG. 1 is a diagram illustrating an example of a configuration of a plasma processing system. In one embodiment, the plasma processing system includes a plasma processing apparatus 1 and a controller 2. The plasma processing system is an example of a substrate processing system, and the plasma processing apparatus 1 is an example of the substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas supply port via which at least one processing gas is supplied into the plasma processing space, and at least one gas exhaust port via which the gas is exhausted from the plasma processing space. The gas supply port is connected to a gas supplier 20, which will be described later, and the gas exhaust port is connected to an exhaust system 40, which will be described later. The substrate support 11 is disposed in the plasma processing space and has a substrate support surface for supporting a substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave plasma (HWP), surface wave plasma (SWP), or the like. Various types of plasma generators, including an alternating current (AC) plasma generator and a direct current (DC) plasma generator, may be used. In one embodiment, an AC signal (AC power) used by the AC plasma generator has a frequency within a range from 100 kHz to 10 GHz. Accordingly, the AC signal includes a radio frequency (RF) signal and a microwave signal. In one embodiment, the RF signal has a frequency in a range of 100 kHz to 150 MHz.

The controller 2 processes computer-executable instructions for instructing the plasma processing apparatus 1 to execute various steps described in the disclosure. The controller 2 may be configured to control elements of the plasma processing apparatus 1 to execute the various steps described herein. In one embodiment, a portion or the entirety of the controller 2 may be provided in the plasma processing apparatus 1. The controller 2 may include a processor 2*a*1, a storage 2*a*2, and a communication interface 2*a*3. The controller 2 is implemented, for example, by a computer 2*a*. The processor 2*al* may be configured to read a program from the storage 2*a*2 and perform various control operations by executing the read program. The program may be stored in advance in the storage 2*a*2, or may be acquired via a medium when necessary. The acquired program is stored in the storage 2*a*2, read from the storage 2*a*2 by the processor 2*a*1, and executed thereby. The medium may be any of various storage media readable by the computer 2*a*, or may be a communication line connected to the communication interface 2*a*3. The processor 2*al* may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN). The functionality of the elements disclosed herein may be implemented using circuitry or processing circuitry which includes general purpose processors, special purpose processors, integrated circuits, ASICs ("Application Specific Integrated Circuits"), FPGAs ("Field-Programmable Gate Arrays"), conventional circuitry and/or combinations thereof which are programmed, using one or more programs stored in one or more memories, or otherwise configured to perform the disclosed functionality. Processors and controllers are considered processing circuitry or circuitry as they include transistors and other circuitry therein. In the disclosure, the circuitry, units, or means are hardware that carry out or are programmed to perform the recited functionality. The hardware may be any hardware disclosed herein which is programmed or configured to carry out the recited functionality. There is a memory that stores a computer program which includes computer instructions. These computer instructions provide the logic and routines that enable the hardware (e.g., processing circuitry or circuitry) to perform the method disclosed herein. This computer program can be implemented in known formats as a computer-readable storage medium, a computer program product, a memory device, a record medium such as a CD-ROM or DVD, and/or the memory of a FPGA or ASICS.

Figure 2:
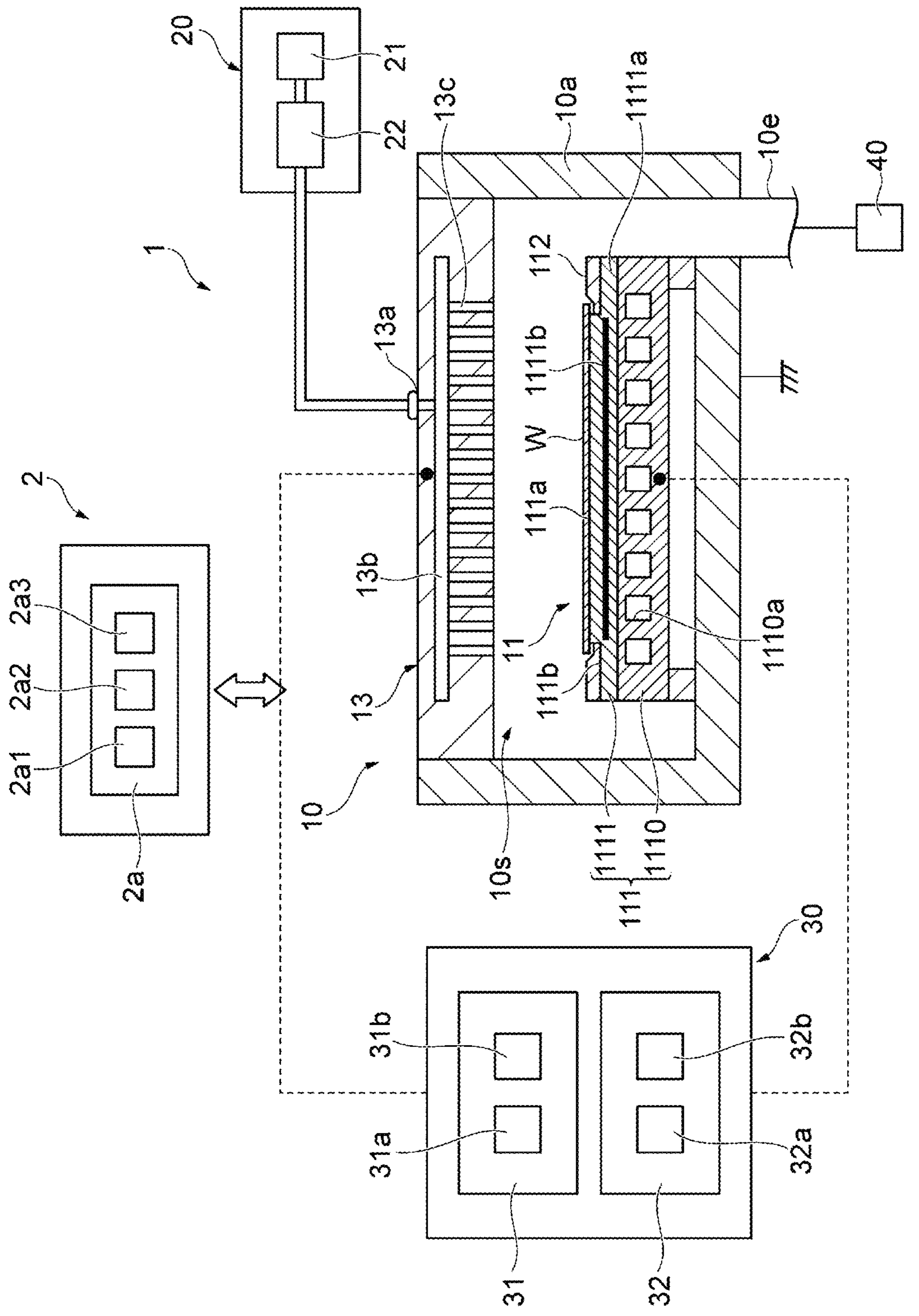
FIG. 2 is a diagram illustrating an example of a configuration of a capacitively-coupled plasma processing apparatus according to one or more embodiments of the present application.

Hereinafter, an example of a configuration of a capacitively-coupled plasma processing apparatus as an example of the plasma processing apparatus 1 will be described. FIG. 2 is a diagram illustrating the example of the configuration of the capacitively-coupled plasma processing apparatus.

The capacitively-coupled plasma processing apparatus 1 includes the plasma processing chamber 10, the gas supplier 20, a power source 30, and the exhaust system 40. The plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 forms at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111*a*, which supports a substrate W, and an annular region 111*b*, which supports the ring assembly 112. A wafer is an example of the substrate W. The annular region 111*b* of the main body 111 surrounds the central region 111*a* of the main body 111 in a plan view. The substrate W is disposed on the central region 111*a* of the main body 111. The ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a*, and an electrostatic electrode 1111*b* disposed in the ceramic member 1111*a*. The ceramic member 1111*a* has the central region 111*a*. In one embodiment, the ceramic member 1111*a* also has the annular region 111*b*. Another member that surrounds the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. At least one RF/DC electrode coupled to an RF power source 31 and/or a DC power source 32, which will be described later, may be disposed in the ceramic member 1111*a*. In this case, at least one RF/DC electrode functions as the lower electrode. When a bias RF signal and/or DC signal, which will be described later, is supplied to at least one RF/DC electrode, the RF/DC electrode is also referred to as a bias electrode. The conductive member of the base 1110 and at least one RF/DC electrode may function as a plurality of lower electrodes. The electrostatic electrode 1111*b* may function as the lower electrode. Accordingly, the substrate support 11 includes at least one lower electrode.

The ring assembly 112 includes one or more annular members. In one embodiment, the one or more annular members include one or more edge rings and at least one cover ring. The edge ring is formed of a conductive material or an insulating material, and the cover ring is formed of an insulating material.

The substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as a brine or gas, flows through the flow path 1110*a*. In one embodiment, the flow path 1110*a* is formed in the base 1110, and one or more heaters are disposed in the ceramic member 1111*a* of the electrostatic chuck 1111. The substrate support 11 may include a heat transfer gas supplier configured to supply a heat transfer gas to a gap between a rear surface of the substrate W and the central region 111*a*.

The shower head 13 is configured to introduce at least one processing gas from the gas supplier 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. The shower head 13 includes at least one upper electrode. The gas introduction unit may include, in addition to the shower head 13, one or more side gas injectors (SGI) that are attached to one or more openings formed in the sidewall 10*a*.

The gas supplier 20 may include at least one gas source 21 and at least one flow rate controller 22. In one embodiment, the gas supplier 20 is configured to supply at least one processing gas from the respective corresponding gas sources 21 to the shower head 13 via the respective corresponding flow rate controllers 22. The flow rate controller 22 may include, for example, a mass flow controller or a pressure-controlled flow rate controller. Further, the gas supplier 20 may include at least one flow rate modulation device that modulates or pulses a flow rate of at least one processing gas.

The power source 30 includes the RF power source 31 coupled to the plasma processing chamber 10 via at least one impedance matching circuit. The RF power source 31 is configured to supply at least one RF signal (RF power) to at least one lower electrode and/or at least one upper electrode. Accordingly, plasma is formed from at least one processing gas supplied into the plasma processing space 10*s*. Accordingly, the RF power source 31 may function as at least a part of the plasma generator 12. Supplying the bias RF signal to at least one lower electrode can generate a bias potential in the substrate W to attract an ionic component in the formed plasma to the substrate W.

In one embodiment, the RF power source 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In one embodiment, the source RF signal has a frequency within a range from 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a frequency lower than the frequency of the source RF signal. In one embodiment, the bias RF signal has a frequency within a range from 100 kHz to 60 MHz. In one embodiment, the second RF generator 31*b* may be configured to generate a plurality of bias RF signals having different frequencies. The generated one or more bias RF signals are supplied to at least one lower electrode. In various embodiments, at least one of the source RF signal and the bias RF signal may be pulsed.

The power source 30 may include the DC power source 32 coupled to the plasma processing chamber 10. The DC power source 32 includes a first DC generator 32*a* and a second DC generator 32*b*. In one embodiment, the first DC generator 32*a* is connected to at least one lower electrode and configured to generate a first DC signal. The generated first DC signal is applied to the at least one lower electrode. In one embodiment, the second DC generator 32*b* is connected to at least one upper electrode and configured to generate a second DC signal. The generated second DC signal is applied to the at least one upper electrode.

In various embodiments, the first and second DC signals may be pulsed. In this case, a sequence of voltage pulses is applied to at least one lower electrode and/or at least one upper electrode. The voltage pulses may each have a rectangular, trapezoidal, or triangular pulse waveform or a combination thereof. In one embodiment, a waveform generator that generates the sequence of the voltage pulses from a DC signal is connected between the first DC generator 32*a* and at least one lower electrode. Accordingly, the first DC generator 32*a* and the waveform generator form a voltage pulse generator. When the second DC generator 32*b* and the waveform generator form a voltage pulse generator, the voltage pulse generator is connected to at least one upper electrode. The voltage pulse may have a positive polarity or a negative polarity. The sequence of the voltage pulses may include one or more positive voltage pulses and one or more negative voltage pulses in one cycle. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* provided at a bottom portion of the plasma processing chamber 10. The exhaust system 40 may include a pressure adjusting valve and a vacuum pump. The pressure adjusting valve adjusts a pressure in the plasma processing space 10*s*. The vacuum pump may include a turbo molecular pump, a dry pump, or a combination thereof.

Hereinafter, temperature control systems according to one or more embodiments of the present application that may be adopted in the plasma processing system will be described.

First Embodiment

Figure 3:
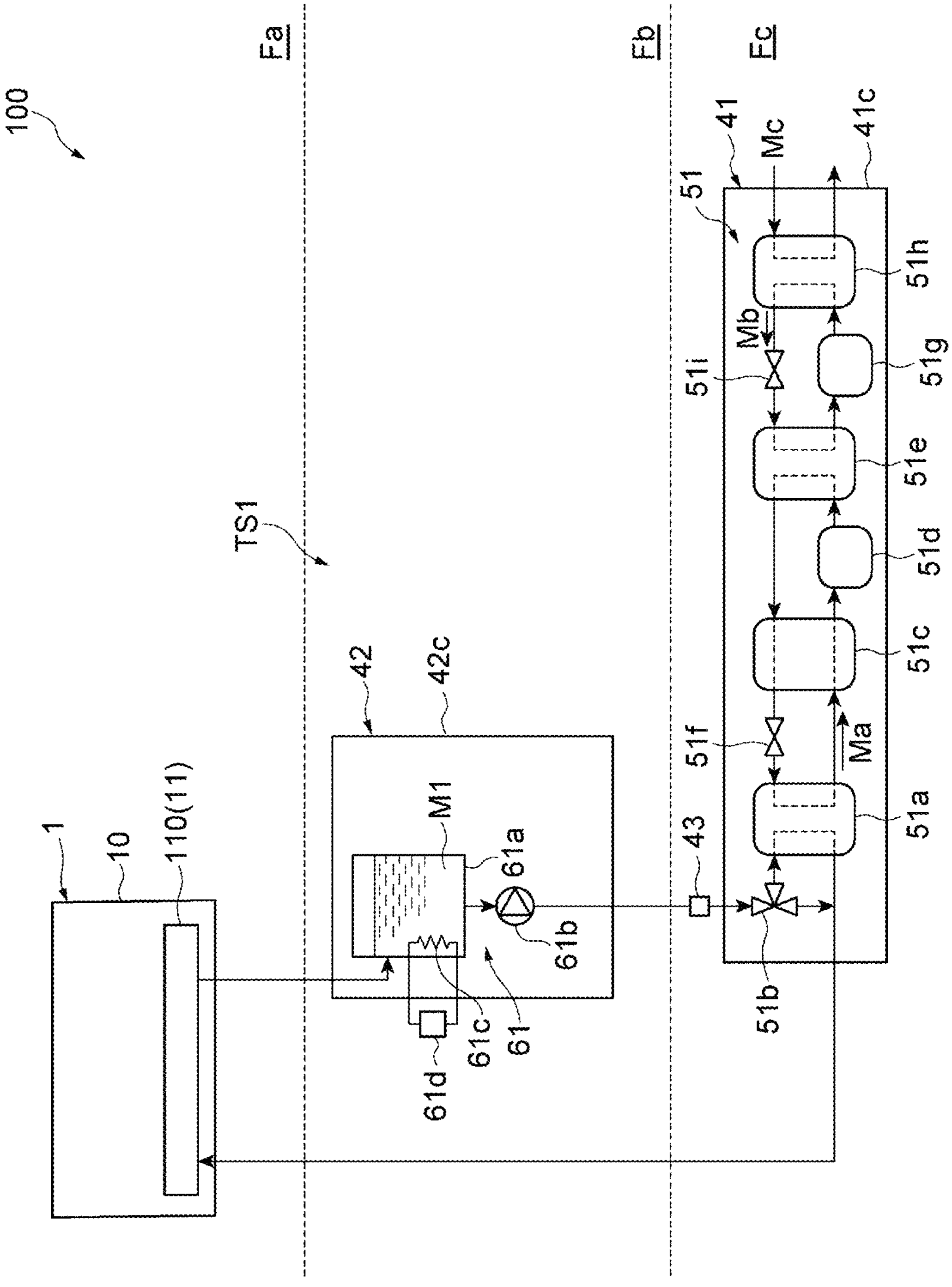
FIG. 3 is a diagram schematically illustrating a temperature control system according to one or more embodiments of the present application.

FIG. 3 is a diagram schematically illustrating a temperature control system according to one or more embodiments of the present application. In FIG. 3, arrows indicate flows of a temperature-controlled medium M1 (first temperature-controlled medium) or the like. The temperature-controlled medium M1 may be a coolant such as a brine. FIG. 3 illustrates a configuration of a temperature control system TS1 in a plasma processing system 100. In the plasma processing system 100, the plasma processing apparatus 1 includes a first member 110. The first member 110 may be, for example, the substrate support 11 for supporting the substrate W.

As illustrated in FIG. 3, the temperature control system TS1 includes a first segment 41, a second segment 42, and a connector 43. The first segment 41 includes a temperature control circuit 51 (first temperature control circuit) and a case 41*c* (first case). The temperature control circuit 51 is configured to adjust a temperature of the temperature-controlled medium M1 to, for example, a first temperature T1. The temperature control circuit 51 may include an apparatus for adjusting the temperature of the temperature-controlled medium M1, and may include, for example, a heat exchanger 51*a* (first heat exchanger). The temperature control circuit 51 is accommodated in the case 41*c*. In one embodiment, the temperature control circuit 51 may be a refrigeration circuit. The heat exchanger 51*a* may be an evaporator.

The second segment 42 includes a circulator 61 (first circulator) and a case 42*c* (second case). The circulator 61 is a part of a first circulation system. The circulator 61 is accommodated in the case 42*c* different from the case 41*c*. The first circulation system is configured to circulate the temperature-controlled medium M1 through a first flow path (for example, the flow path 1110*a*) in the first member 110. The circulator 61 may include a tank 61*a* (first tank) in which the temperature-controlled medium M1 is stored, and a pump 61*b* (first pump) for circulating the temperature-controlled medium M1. In the first circulation system, the tank 61*a* is connected between one end (outlet) of the first flow path and the pump 61*b*, and the heat exchanger 51*a* is connected between a pump 62*b* and the other end (inlet) of the first flow path. The second segment 42 may further include a heater 61*c*. The heater 61*c* is provided in the tank 61*a* to heat the temperature-controlled medium M1. The heater 61*c* is connected to a heater power source 61*d*, and generates heat by the power from the heater power source 61*d*.

The connector 43 connects the temperature control circuit 51 and the circulator 61 to allow the temperature-controlled medium M1 to flow therebetween. The connector 43 is a part of the first circulation system and is connected between the pump 61*b* and the heat exchanger 51*a*. The connector 43 is disposed between the first segment 41 and the second segment 42. The connector 43 may be a joint that connects a pipe extending from the first segment 41 and a pipe extending from the second segment to each other. The connector 43 may connect a pipe extending from the pump 61*b* and a pipe extending from a three-way valve 51*b* to be described later to each other.

In one embodiment, the first segment 41 is disposed on a floor Fc. The second segment 42 is disposed on a floor Fb different from the floor Fc. The floor Fc may be a floor below the floor Fb. The floor Fb may be the same floor as, or different from, a floor Fa on which the plasma processing apparatus 1 is disposed. In an example, the floor Fb is a floor between the floor Fc and the floor Fa on which the plasma processing apparatus 1 is disposed.

In one embodiment, the first segment may include, in addition to the heat exchanger 51*a*, the three-way valve 51*b*, a recuperator 51*c*, a compressor 51*d*, a cascade condenser 51*e*, an expansion valve 51*f*, a compressor 51*g*, a condenser 51*h*, and an expansion valve 51*i*.

A first port of the three-way valve 51*b* is connected to the connector 43 through a pipe. A second port of the three-way valve 51*b* is connected to an inlet of the heat exchanger 51*a* for the temperature-controlled medium M1. A pipe extending from a third port of the three-way valve 51*b* joins a pipe that connects an outlet of the heat exchanger 51*a* for the temperature-controlled medium M1 and an inlet of the first flow path to each other.

The heat exchanger 51*a* is configured to adjust the temperature of the temperature-controlled medium M1 by heat exchange between the temperature-controlled medium M1 and a temperature-controlled medium Ma. The heat exchanger 51*a*, the recuperator 51*c*, the compressor 51*d*, the cascade condenser 51*e*, and the expansion valve 51*f* form a circuit for circulating the temperature-controlled medium Ma through the heat exchanger 51*a*. An outlet of the heat exchanger 51*a* for the temperature-controlled medium Ma is connected to a first inlet of the recuperator 51*c*. A first outlet of the recuperator 51*c* is connected to an inlet of the cascade condenser 51*e* for the temperature-controlled medium Ma via the compressor 51*d*. An outlet of the cascade condenser 51*e* for the temperature-controlled medium Ma is connected to a second inlet of the recuperator 51*c*. A second outlet of the recuperator 51*c* is connected to an inlet of the heat exchanger 51*a* for the temperature-controlled medium Ma via the expansion valve 51*f*.

The cascade condenser 51*e* is configured to adjust the temperature of the temperature-controlled medium Ma by heat exchange between the temperature-controlled medium Ma and a temperature-controlled medium Mb. The cascade condenser 51*e*, the compressor 51*g*, the condenser 51*h*, and the expansion valve 51*i* form a circuit for circulating the temperature-controlled medium Mb through the cascade condenser 51*e*. An outlet of the cascade condenser 51*e* for the temperature-controlled medium Mb is connected to an inlet of the condenser 51*h* for the temperature-controlled medium Mb via the compressor 51*g*. An outlet of the condenser 51*h* for the temperature-controlled medium Mb is connected to an inlet of the cascade condenser 51*e* for the temperature-controlled medium Mb via the expansion valve 51*i*. The condenser 51*h* is configured to adjust a temperature of the temperature-controlled medium Mb by heat exchange between the temperature-controlled medium Mb and a temperature-controlled medium Mc.

In the temperature control system TS1, after the temperature of the temperature-controlled medium M1 is adjusted to, for example, the first temperature T1 by the temperature control circuit 51 of the first segment 41, the temperature-controlled medium M1 is supplied to the first flow path (for example, the flow path 1110*a*) in the first member 110. When the temperature-controlled medium M1 cools the first member 110, the temperature of the temperature-controlled medium M1 increases from the first temperature T1 by ΔT1. The temperature-controlled medium M1 whose temperature has increased by ΔT1 is returned to the temperature control circuit 51 by the circulator 61 of the second segment 42. Then, after the temperature of the temperature-controlled medium M1 is adjusted to the first temperature T1 by the temperature control circuit 51, the temperature-controlled medium M1 is supplied again to the first flow path (for example, the flow path 1110*a*) in the first member 110.

In the temperature control system TS1, the second segment 42 forming a part of the first circulation system is separated from the first segment 41 that includes the temperature control circuit 51. Accordingly, it is possible to reduce a size of a unit forming the temperature control system TS1. In the temperature control system TS1, the second segment 42 can be disposed on the floor Fb different from the floor Fc on which the first segment 41 is disposed. Accordingly, it is possible to reduce an arrangement area of the unit of the temperature control system TS1 on the floor Fc. In an example, the arrangement area of the temperature control system TS1 on the floor Fc can be reduced to 60% or less, 50% or less, or 40% or less of an arrangement area of a temperature control system in the related art.

Since the temperature control system TS1 is divided into the first segment 41 and the second segment 42, a degree of freedom of a design thereof is high. Since the second segment 42 can be disposed immediately below the plasma processing apparatus 1, the temperature control system TS1 can shorten a hose (pipe) that connects the second segment 42 and the plasma processing apparatus 1, and is also excellent in temperature control efficiency. Further, when an abnormality occurs in either the first segment 41 or the second segment 42, only the segment in which the abnormality has occurred can be replaced. Therefore, recovery work during the abnormality is shortened.

Second Embodiment

Figure 4:
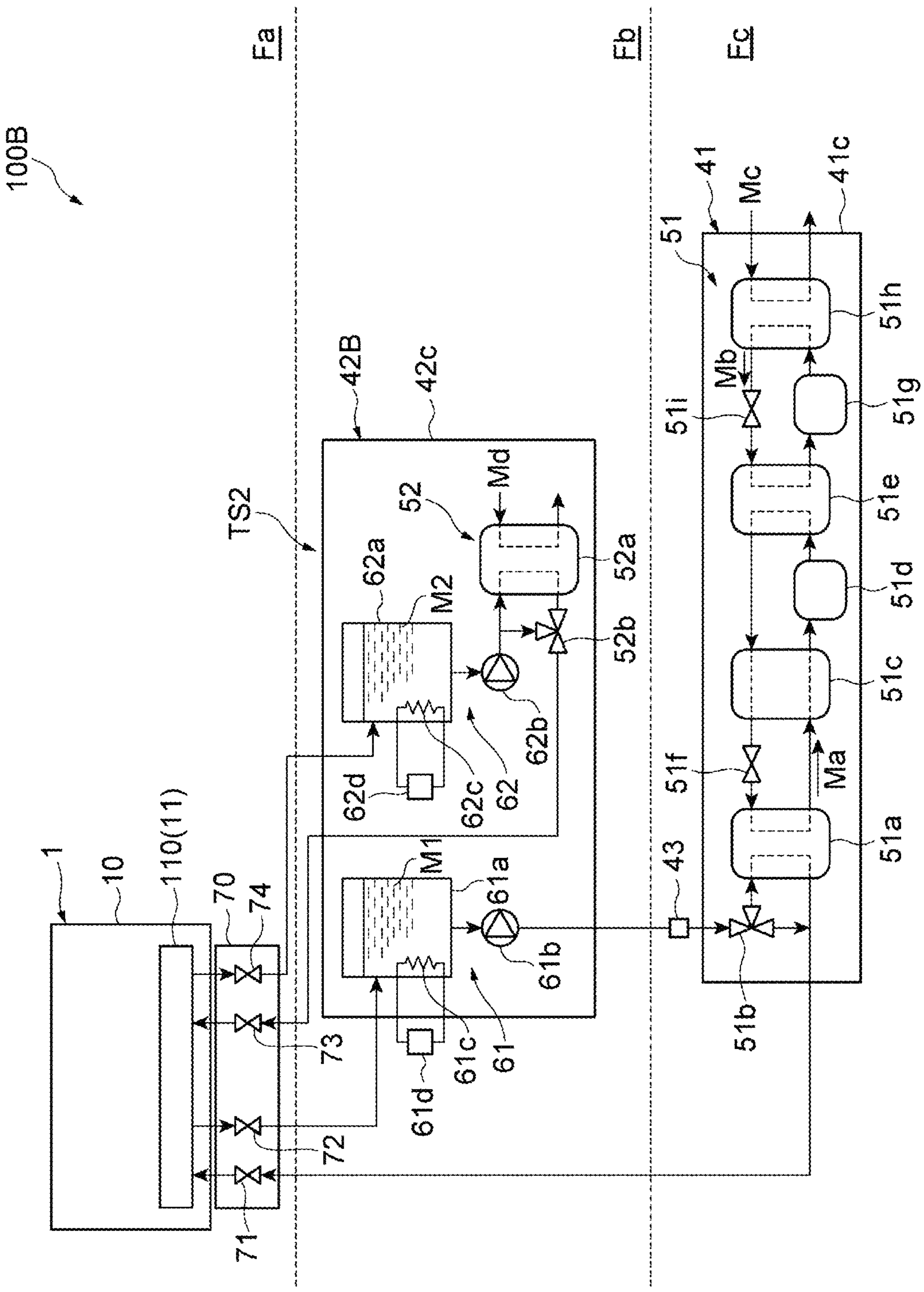
FIG. 4 is a diagram schematically illustrating a temperature control system according to one or more embodiments of the present application.

Next, one or more embodiments of the present application will be described. FIG. 4 is a diagram schematically illustrating a temperature control system according to according to one or more embodiments of the present application. In FIG. 4, arrows indicate flows of the temperature-controlled medium M1, a temperature-controlled medium M2 (a second temperature-controlled medium), or the like. The temperature-controlled medium M2 may be a coolant such as a brine. The temperature-controlled medium M2 may be the same coolant as the temperature-controlled medium M1. FIG. 4 illustrates a configuration of a temperature control system TS2 in a plasma processing system 100B. In the plasma processing system 100B, the plasma processing apparatus 1 includes the first member 110. The first member 110 may be, for example, the substrate support 11 for supporting the substrate W. Hereinafter, the plasma processing system 100B will be described from the viewpoint of differences from the plasma processing system 100.

The temperature control system TS2 includes the first segment 41, a second segment 42B, and the connector 43. The first segment 41 and the connector 43 are similar to the first segment 41 and the connector 43 of the temperature control system TS1, respectively.

The temperature control system TS2 may further include a switcher 70. The switcher 70 may be configured to switch, between the temperature-controlled medium M1 and the temperature-controlled medium M2, a temperature-controlled medium circulating through the first flow path (for example, the flow path 1110*a*). In one embodiment, the switcher 70 may include valves 71 to 74. Each of the valves 71 to 74 is, for example, an opening/closing valve. The valve 71 is connected between the outlet of the heat exchanger 51*a* for the temperature-controlled medium M1 and the inlet of the first flow path. The valve 72 is connected between an outlet of the first flow path and the tank 61*a*.

In the temperature control system TS2, the second segment 42B is different from the second segment 42 of the temperature control system TS1 in that the second segment 42B further includes a temperature control circuit 52 (second temperature control circuit) and a circulator 62 (second circulator). In the temperature control system TS2, the second segment 42B may further include a three-way valve 52*b*. The three-way valve 52*b* is accommodated in the case 42*c*.

The temperature control circuit 52 is configured to adjust a temperature of the temperature-controlled medium M2 to, for example, a second temperature T2. The temperature control circuit 52 may include an apparatus for adjusting the temperature of the temperature-controlled medium M2, and may include, for example, a heat exchanger 52*a* (second heat exchanger). The second temperature T2 may be higher than the first temperature T1. The heat exchanger 52*a* is configured to adjust the temperature of the temperature-controlled medium M2 by heat exchange between the temperature-controlled medium M2 and a temperature-controlled medium Md. In one embodiment, the heat exchanger 52*a* may be a condenser.

The circulator 62 is a part of a second circulation system. The circulator 62, together with the circulator 61 and the temperature control circuit 52, is accommodated in the case 42*c*. The second circulation system is configured to circulate the temperature-controlled medium M2, which is adjusted to the second temperature T2, through the first flow path (for example, the flow path 1110*a*). The circulator 62 may include a tank 62*a* (second tank) in which the temperature-controlled medium M2 is stored, and the pump 62*b* (second pump) for circulating the temperature-controlled medium M2.

In the second circulation system, the tank 62*a* is connected between the outlet of the first flow path and the pump 62*b*, and the heat exchanger 52*a* is connected between the pump 62*b* and the inlet of the first flow path. An outlet of the heat exchanger 52*a* for the temperature-controlled medium M2 may be connected to the inlet of the first flow path via the valve 73. The outlet of the first flow path may be connected to the tank 62*a* via the valve 74. In one embodiment, the pump 62*b* may be connected to an inlet of the heat exchanger 52*a* for the temperature-controlled medium M2 and a first port of the three-way valve 52*b*. The outlet of the heat exchanger 52*a* for the temperature-controlled medium M2 may be connected to a second port of the three-way valve 52*b*. A third port of the three-way valve 52*b* may be connected to the inlet of the first flow path.

The second segment 42B may further include a heater 62*c*. The heater 62*c* is provided in the tank 62*a* to heat the temperature-controlled medium M2. The heater 62*c* is connected to a heater power source 62*d*, and generates heat by the power from the heater power source 62*d*.

In the temperature control system TS2, after the temperature of the temperature-controlled medium M2 is adjusted to, for example, the second temperature T2 by the temperature control circuit 52 of the second segment 42B, the temperature-controlled medium M2 is supplied to the first flow path (for example, the flow path 1110*a*) in the first member 110. When the temperature-controlled medium M2 cools the first member 110, the temperature of the temperature-controlled medium M2 increases from the second temperature T2 by ΔT2. The temperature-controlled medium M2 whose temperature has increased by ΔT2 is returned to the temperature control circuit 52 by the circulator 62 of the second segment 42B. Then, after the temperature of the temperature-controlled medium M2 is adjusted to the second temperature T2 by the temperature control circuit 52, the temperature-controlled medium M2 is supplied again to the first flow path (for example, the flow path 1110*a*) in the first member 110.

The switcher 70 may be configured to switch the temperature-controlled medium, which is supplied to the first flow path, from the temperature-controlled medium M1 to the temperature-controlled medium M2 or from the temperature-controlled medium M2 to the temperature-controlled medium M1. Alternatively, the switcher 70 may be configured to supply, to the first flow path, a temperature-controlled medium which is acquired by mixing the temperature-controlled medium M1 and the temperature-controlled medium M2 at a designated ratio. In this case, the temperature-controlled medium M1 and the temperature-controlled medium M2 may be the same temperature-controlled medium.

In the temperature control system TS2, the second segment 42B is separated from the first segment 41, similarly to the temperature control system TS1. Accordingly, it is possible to reduce a size of a unit forming the temperature control system TS2. Similar to the temperature control system TS1, the temperature control system TS2 can dispose the second segment 42B on the floor Fb different from the floor Fc on which the first segment 41 is disposed. Accordingly, similar to the temperature control system TS1, the temperature control system TS2 can reduce an arrangement area of the unit of the temperature control system TS2 on the floor Fc. Similar to the temperature control system TS1, the temperature control system TS2 can improve a degree of freedom of a design, improve temperature control efficiency, and shorten recovery work during an abnormality.

Third Embodiment

Figure 5:
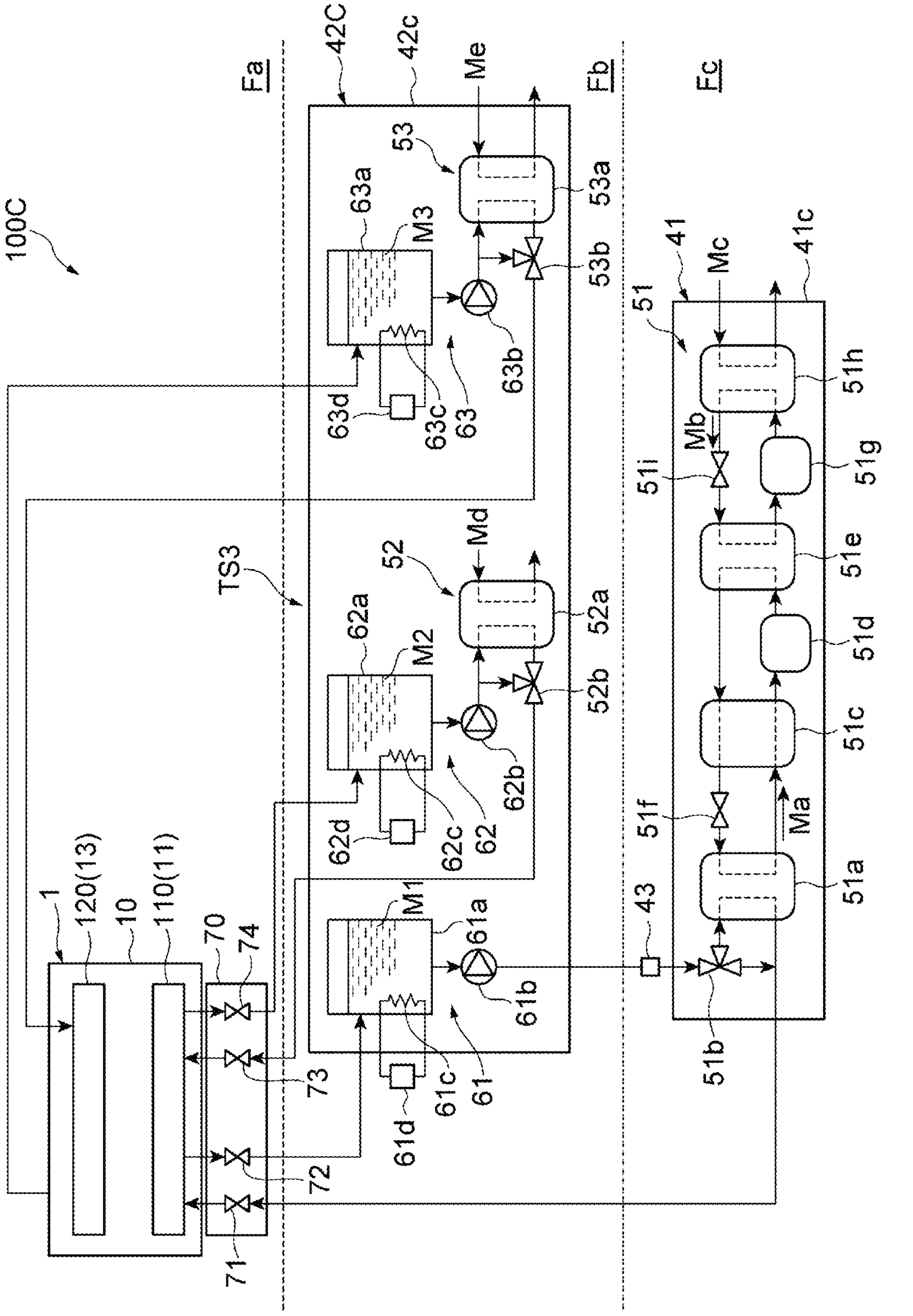
FIG. 5 is a diagram schematically illustrating a temperature control system according to one or more embodiments of the present application.

Next, one or more embodiments of the present application will be described. FIG. 5 is a diagram schematically illustrating a temperature control system according to one or more embodiments of the present application. In FIG. 5, arrows indicate flows of the temperature-controlled medium M1, the temperature-controlled medium M2, a temperature-controlled medium M3 (a third temperature-controlled medium), or the like. The temperature-controlled medium M3 may be a coolant such as a brine. The temperature-controlled medium M3 may be the same coolant as the temperature-controlled medium M1 or the temperature-controlled medium M2.

FIG. 5 illustrates a configuration of a temperature control system TS3 in a plasma processing system 100C. In the plasma processing system 100C, the plasma processing apparatus 1 includes the first member 110 and a second member 120. The first member 110 may be, for example, the substrate support 11 for supporting the substrate W. The second member 120 may be an upper electrode of the plasma processing apparatus 1. Hereinafter, the plasma processing system 100C will be described from the viewpoint of differences from the plasma processing system 100B.

Figure 6:
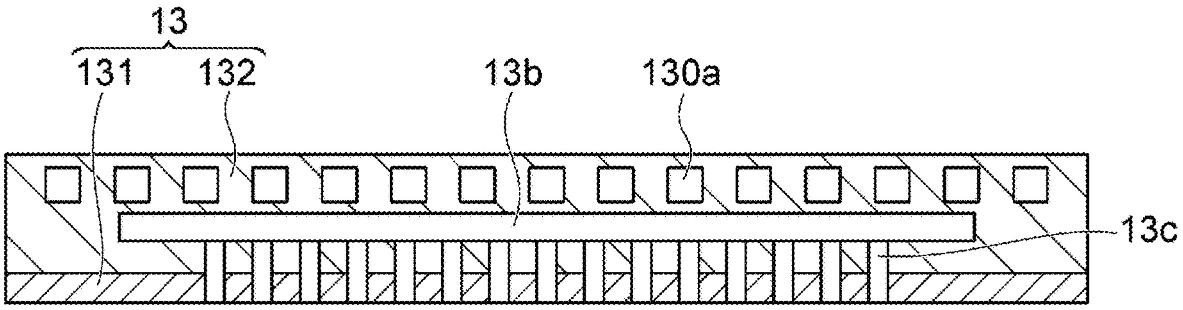
FIG. 6 is a cross-sectional view illustrating an upper electrode which is an example of a second member in a temperature control system according to one or more embodiments of the present application.

FIG. 6 is a cross-sectional view illustrating an upper electrode which is an example of the second member in a temperature control system according to one or more embodiments of the present application. As illustrated in FIG. 6, the second member 120 may be an upper electrode provided in the shower head 13. The upper electrode has a flow path 130*a* therein. In one embodiment, the flow path 130*a* is a second flow path in the second member 120. The upper electrode may include a ceiling plate 131 and a support 132. The ceiling plate 131 defines the plasma processing space 10*s* from above. The support 132 is provided on the ceiling plate 131. The support 132 has the flow path 130*a* and at least one gas diffusion chamber 13*b* therein. The ceiling plate 131 and the support 132 have a plurality of gas introduction ports 13*c*. The flow path 130*a* may be provided in the support 132.

As illustrated in FIG. 5, the temperature control system TS3 includes the first segment 41, a second segment 42C, and the connector 43. The first segment 41 and the connector 43 are similar to the first segment 41 and the connector 43 of the temperature control system TS2, respectively.

In the temperature control system TS3, the second segment 42C is different from the second segment 42B of the temperature control system TS2 in that the second segment 42C further includes a temperature control circuit 53 (third temperature control circuit) and a circulator 63 (third circulator). In the temperature control system TS3, the second segment 42C may further include a three-way valve 53*b*. The three-way valve 53*b* is accommodated in the case 42*c*.

The temperature control circuit 53 may include an apparatus for adjusting a temperature of the temperature-controlled medium M3, and may include, for example, a heat exchanger 53*a* (third heat exchanger). The heat exchanger 53*a* is configured to adjust the temperature of the temperature-controlled medium M3 by heat exchange between the temperature-controlled medium M3 and a temperature-controlled medium Me. In one embodiment, the heat exchanger 53*a* may be a condenser.

The circulator 63 is a part of a third circulation system. The circulator 63, together with the circulator 61, the temperature control circuit 52, the circulator 62, and the temperature control circuit 53, is accommodated in the case 42*c*. The third circulation system is configured to circulate the temperature-controlled medium M3, which is adjusted to a third temperature T3, through the second flow path (for example, the flow path 130*a*) in the second member 120 different from the first member 110. The circulator 63 may include a tank 63*a* (third tank) in which the temperature-controlled medium M3 is stored, and a pump 63*b* (third pump) for circulating the temperature-controlled medium M3.

In the third circulation system, the tank 63*a* is connected between an outlet of the second flow path and the pump 63*b*, and the heat exchanger 53*a* is connected between the pump 63*b* and an inlet of the second flow path. An outlet of the heat exchanger 53*a* for the temperature-controlled medium M3 is connected to the inlet of the second flow path. The outlet of the second flow path is connected to the tank 63*a*. In one embodiment, the pump 63*b* may be connected to an inlet of the heat exchanger 53*a* for the temperature-controlled medium M3 and a first port of the three-way valve 53*b*. The outlet of the heat exchanger 53*a* for the temperature-controlled medium M3 may be connected to a second port of the three-way valve 53*b*. A third port of the three-way valve 53*b* may be connected to the inlet of the second flow path.

The second segment 42C may further include a heater 63*c*. The heater 63*c* is provided in the tank 63*a* to heat the temperature-controlled medium M3. The heater 63*c* is connected to a heater power source 63*d*, and generates heat by the power from the heater power source 63*d*.

In the temperature control system TS3, after the temperature of the temperature-controlled medium M3 is adjusted to, for example, the third temperature T3 by the temperature control circuit 53 of the second segment 42C, the temperature-controlled medium M3 is supplied to the flow path (for example, the flow path 130*a*) in the second member 120. When the temperature-controlled medium M3 cools the second member 120, the temperature of the temperature-controlled medium M3 increases from the third temperature T3 by ΔT3. The temperature-controlled medium M3 whose temperature has increased by ΔT3 is returned to the temperature control circuit 53 by the circulator 63 of the second segment 42C. Then, after the temperature of the temperature-controlled medium M3 is adjusted to the third temperature T3 by the temperature control circuit 53, the temperature-controlled medium M3 is supplied again to the second flow path (for example, the flow path 130*a*) in the second member 120.

In the temperature control system TS3, the second segment 42C is separated from the first segment 41, similarly to the temperature control system TS1 and the temperature control system TS2. Accordingly, it is possible to reduce a size of a unit forming the temperature control system TS3. Similar to the temperature control system TS1 and the temperature control system TS2, the temperature control system TS3 can dispose the second segment 42C on the floor Fb different from the floor Fc on which the first segment 41 is disposed. Accordingly, similar to the temperature control system TS1 and the temperature control system TS2, the temperature control system TS3 can reduce an arrangement area of the unit of the temperature control system TS3 on the floor Fc. Similar to the temperature control system TS1 and the temperature control system TS2, the temperature control system TS3 can improve a degree of freedom of a design, improve temperature control efficiency, and shorten recovery work during an abnormality.

Fourth Embodiment

Figure 7:
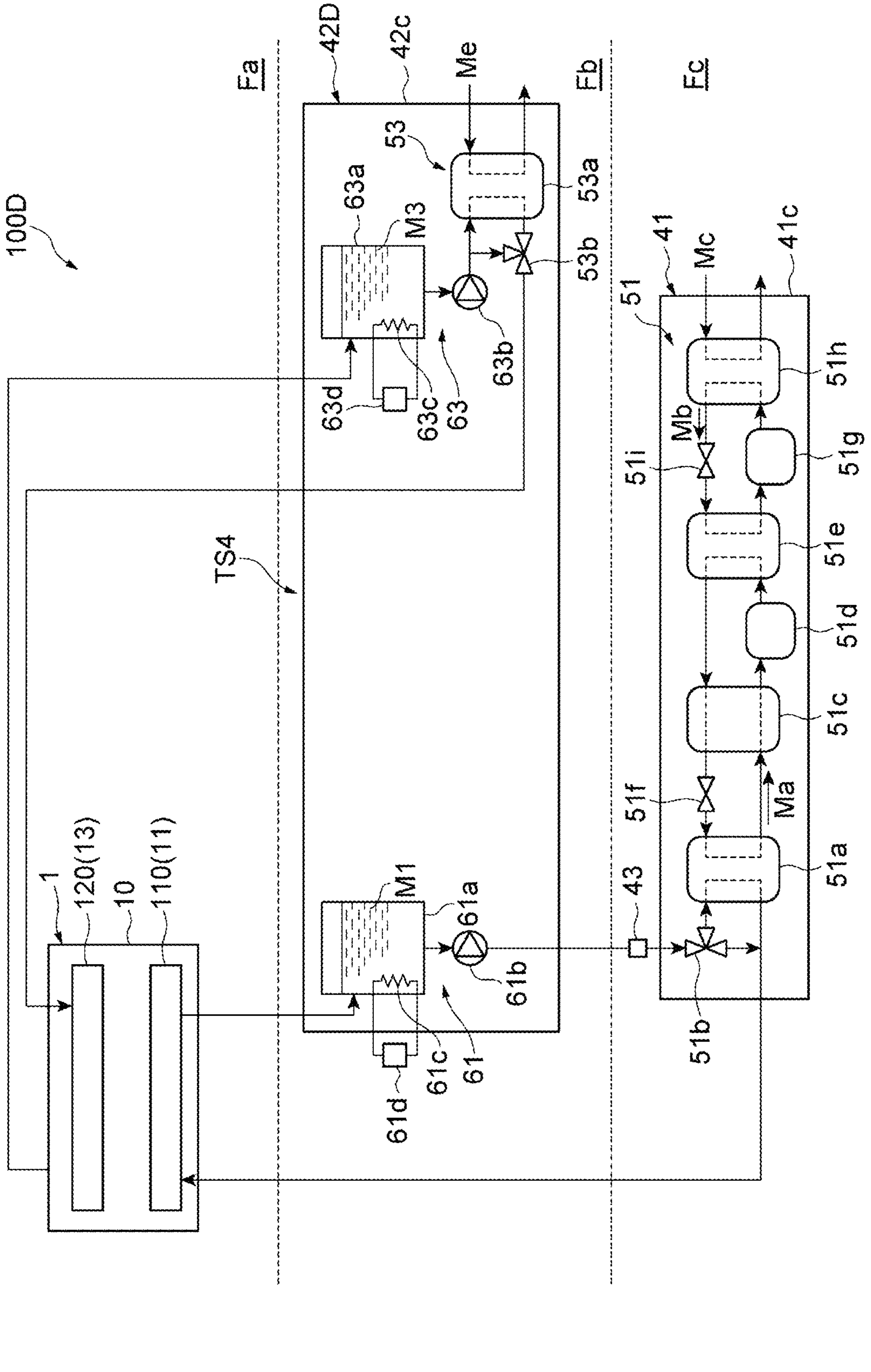
FIG. 7 is a diagram schematically illustrating a temperature control system according to one or more embodiments of the present application.

Next, one or more embodiments of the present application will be described. FIG. 7 is a diagram schematically illustrating a temperature control system according to one or more embodiments of the present application. FIG. 7 illustrates a configuration of a temperature control system TS4 in a plasma processing system 100D. Hereinafter, the plasma processing system 100D will be described from the viewpoint of differences from the plasma processing system 100C.

A second segment 42D of the temperature control system TS4 is different from the second segment 42C in that the second segment 42D does not include the temperature control circuit 52 and the circulator 62. The plasma processing system 100D does not include the switcher 70. The temperature control circuit 51 and the circulator 61 of the temperature control system TS4 are connected to the first flow path, similarly to the temperature control circuit 51 and the circulator 61 of the temperature control system TS1. Other components of the temperature control system TS4 are similar to the corresponding components of the temperature control system TS3.

In the temperature control system TS4, the second segment 42D also is separated from the first segment 41. Accordingly, it is possible to reduce a size of a unit forming the temperature control system TS4. In the temperature control system TS4, the second segment 42D can also be disposed on the floor Fb different from the floor Fc on which the first segment 41 is disposed. Accordingly, in the temperature control system TS4, it is also possible to reduce an arrangement area of the unit of the temperature control system TS4 on the floor Fc. The temperature control system TS4 can also improve a degree of freedom of a design, improve temperature control efficiency, and shorten recovery work during an abnormality.

Although various exemplary embodiments have been described above, various additions, omissions, substitutions, and changes may be made without being limited to the exemplary embodiments described above. In addition, other embodiments may be formed by combining elements in different embodiments.

Hereinafter, various exemplary embodiments included in the disclosure will be described in the following [E1] to [E18].

[E1]

A temperature control system including:

a first segment that includes a first temperature control circuit and a first case accommodating the first temperature control circuit therein, the first temperature control circuit including a first heat exchanger configured to exchange heat with a first temperature-controlled medium;

a second segment that includes a first tank and a first pump in a first circulation system configured to circulate the first temperature-controlled medium through a first flow path in a first member of a plasma processing apparatus and includes a second case accommodating the first tank and the first pump therein, in the first circulation system, the first tank being connected between the first flow path and the first pump, and the first heat exchanger being connected between the first pump and the first flow path; and a connector that is a part of the first circulation system, is disposed between the first segment and the second segment, and is connected between the first pump and the first heat exchanger.

[E2]

The temperature control system according to E1, in which the first temperature control circuit is a refrigeration circuit including an evaporator that is the first heat exchanger.

[E3]

The temperature control system according to E1 or E2, in which the second segment further includes a second heat exchanger configured to exchange heat with a second temperature-controlled medium, and a second tank and a second pump in a second circulation system that includes the second heat exchanger and is configured to circulate the second temperature-controlled medium through the first flow path, the second tank is connected between the first flow path and the second pump, and the second heat exchanger is connected between the second pump and the first flow path, the second heat exchanger, the second tank, and the second pump are accommodated in the second case, and the temperature control system further includes a switcher that selectively connects the first circulation system and the second circulation system to the first flow path.

[E4]

The temperature control system according to E3, in which the second heat exchanger is a condenser.

[E5]

The temperature control system according to E3 or E4, in which the second segment further includes a third heat exchanger configured to exchange heat with a third temperature-controlled medium, and a third tank and a third pump in a third circulation system that includes the third heat exchanger and is configured to circulate the third temperature-controlled medium through a second flow path in a second member of the plasma processing apparatus, the third tank is connected between the second flow path and the third pump, and the third heat exchanger is connected between the third pump and the second flow path, and the third heat exchanger, the third tank, and the third pump are accommodated in the second case.

[E6]

The temperature control system according to E1 or E2, in which the second segment further includes a second heat exchanger configured to exchange heat with a second temperature-controlled medium, and a second tank and a second pump in a second circulation system that includes the second heat exchanger and is configured to circulate the second temperature-controlled medium through a second flow path in a second member of the plasma processing apparatus, the second tank is connected between the second flow path and the second pump, and the second heat exchanger is connected between the second pump and the second flow path, and the second heat exchanger, the second tank, and the second pump are accommodated in the second case.

[E7]

The temperature control system according to E5 or E6, in which the second member is an upper electrode of a capacitively-coupled plasma processing apparatus.

[E8]

The temperature control system according to any one of E1 to E7, in which the first member is a substrate support of the plasma processing apparatus.

[E9]

The temperature control system according to any one of E1 to E8, in which the first segment is disposed on a floor below a floor on which the second segment is disposed.

[E10]

A plasma processing system including:

a plasma processing apparatus; and a temperature control system, in which the plasma processing apparatus includes a chamber, and a first member providing a first flow path therein, and the temperature control system includes a first segment that includes a first temperature control circuit and a first case accommodating the first temperature control circuit therein, the first temperature control circuit including a first heat exchanger configured to exchange heat with a first temperature-controlled medium, a second segment that includes a first tank and a first pump in a first circulation system configured to circulate the first temperature-controlled medium through the first flow path and includes a second case accommodating the first tank and the first pump therein, in the first circulation system, the first tank being connected between the first flow path and the first pump, and the first heat exchanger being connected between the first pump and the first flow path, and a connector that is a part of the first circulation system, is disposed between the first segment and the second segment, and is connected between the first pump and the first heat exchanger.

[E11]

The plasma processing system according to E10, in which the first temperature control circuit is a refrigeration circuit including an evaporator that is the first heat exchanger.

[E12]

The plasma processing system according to E10 or E11, in which the second segment further includes a second heat exchanger configured to exchange heat with a second temperature-controlled medium, and a second tank and a second pump in a second circulation system that includes the second heat exchanger and is configured to circulate the second temperature-controlled medium through the first flow path, the second tank is connected between the first flow path and the second pump, and the second heat exchanger is connected between the second pump and the first flow path, the second heat exchanger, the second tank, and the second pump are accommodated in the second case, and the temperature control system further includes a switcher that selectively connects the first circulation system and the second circulation system to the first flow path.

[E13]

The plasma processing system according to E12, in which the second heat exchanger is a condenser.

[E14]

The plasma processing system according to E12 or E13, in which the second segment further includes a third heat exchanger configured to exchange heat with a third temperature-controlled medium, and a third tank and a third pump in a third circulation system that includes the third heat exchanger and is configured to circulate the third temperature-controlled medium through a second flow path in a second member of the plasma processing apparatus, the third tank is connected between the second flow path and the third pump, and the third heat exchanger is connected between the third pump and the second flow path, and the third heat exchanger, the third tank, and the third pump are accommodated in the second case.

[E15]

The plasma processing system according to E10 or E11, in which the second segment further includes a second heat exchanger configured to exchange heat with a second temperature-controlled medium, and a second tank and a second pump in a second circulation system that includes the second heat exchanger and is configured to circulate the second temperature-controlled medium through a second flow path in a second member of the plasma processing apparatus, the second tank is connected between the second flow path and the second pump, and the second heat exchanger is connected between the second pump and the second flow path, and the second heat exchanger, the second tank, and the second pump are accommodated in the second case.

[E16]

The plasma processing system according to E14 or E15, in which the plasma processing apparatus is a capacitively-coupled plasma processing apparatus, and the second member is an upper electrode of the plasma processing apparatus.

[E17]

The plasma processing system according to any one of E10 to E16, in which the first member is a substrate support of the plasma processing apparatus.

[E18]

The plasma processing system according to any one of E10 to E17, in which the first segment is disposed on a floor below a floor on which the second segment is disposed.

From the foregoing, it will be appreciated that various embodiments of the disclosure have been described herein for purposes of illustration, and that various modifications may be made without departing from the scope and spirit of the disclosure. Therefore, the various embodiments disclosed herein are not intended to be limiting, with the true scope and spirit being indicated by the following claims.

The invention claimed is:

1. A temperature control system comprising:

a first segment including a first temperature control circuit and a first case accommodating the first temperature control circuit, the first temperature control circuit including a first heat exchanger configured to exchange heat with a first temperature-controlled medium;

a second segment including a first tank and a first pump in a first circulation system that is configured to circulate the first temperature-controlled medium through a first flow path in a first member of a plasma processing apparatus and the second segment includes a second case accommodating the first tank and the first pump, in the first circulation system, the first tank being connected between the first flow path and the first pump, and the first heat exchanger being connected between the first pump and the first flow path; and a connector that is a part of the first circulation system, the connector being disposed between the first segment and the second segment, and the connector being connected between the first pump and the first heat exchanger.

2. The temperature control system according to claim 1, wherein the first temperature control circuit is a refrigeration circuit, and the first heat exchanger is an evaporator.

3. The temperature control system according to claim 1, wherein the second segment further includes:

a second heat exchanger configured to exchange heat with a second temperature-controlled medium, and a second tank and a second pump in a second circulation system including the second heat exchanger and the second circulation system is configured to circulate the second temperature-controlled medium through the first flow path, the second tank is connected between the first flow path and the second pump, and the second heat exchanger is connected between the second pump and the first flow path, the second heat exchanger, the second tank, and the second pump are accommodated in the second case, and the temperature control system further includes a switcher that selectively connects the first circulation system and the second circulation system to the first flow path.

4. The temperature control system according to claim 3, wherein the second heat exchanger is a condenser.

5. The temperature control system according to claim 3, wherein the second segment further includes:

a third heat exchanger configured to exchange heat with a third temperature-controlled medium, and a third tank and a third pump in a third circulation system including the third heat exchanger and the third pump is configured to circulate the third temperature-controlled medium through a second flow path in a second member of the plasma processing apparatus, the third tank is connected between the second flow path and the third pump, and the third heat exchanger is connected between the third pump and the second flow path, and the third heat exchanger, the third tank, and the third pump are accommodated in the second case.

6. The temperature control system according to claim 1, wherein the second segment further includes:

a second heat exchanger configured to exchange heat with a second temperature-controlled medium, and a second tank and a second pump in a second circulation system including the second heat exchanger and the second circulation system is configured to circulate the second temperature-controlled medium through a second flow path in a second member of the plasma processing apparatus, the second tank is connected between the second flow path and the second pump, and the second heat exchanger is connected between the second pump and the second flow path, and the second heat exchanger, the second tank, and the second pump are accommodated in the second case.

7. The temperature control system according to claim 5, wherein the second member is an upper electrode of a capacitively-coupled plasma processing apparatus.

8. The temperature control system according to claim 1, wherein the first member is a substrate support of the plasma processing apparatus.

9. The temperature control system according to claim 1, wherein the first segment is disposed below a floor on which the second segment is disposed.

10. A plasma processing system comprising:

a plasma processing apparatus; and a temperature control system, wherein the plasma processing apparatus includes:

a chamber; and a first member providing a first flow path therein, and the temperature control system includes:

a first segment including a first temperature control circuit and a first case accommodating the first temperature control circuit, the first temperature control circuit including a first heat exchanger configured to exchange heat with a first temperature-controlled medium, a second segment including a first tank and a first pump in a first circulation system that is configured to circulate the first temperature-controlled medium through the first flow path and the second segment includes a second case accommodating the first tank and the first pump therein, in the first circulation system, the first tank being connected between the first flow path and the first pump, and the first heat exchanger being connected between the first pump and the first flow path;

and a connector that is a part of the first circulation system, the connector being disposed between the first segment and the second segment, and the connector being connected between the first pump and the first heat exchanger.

11. The plasma processing system according to claim 10, wherein the first temperature control circuit is a refrigeration circuit, and the first heat exchanger is an evaporator.

12. The plasma processing system according to claim 10, wherein the second segment further includes:

a second heat exchanger configured to exchange heat with a second temperature-controlled medium; and a second tank and a second pump in a second circulation system including the second heat exchanger and the second circulation system is configured to circulate the second temperature-controlled medium through the first flow path, the second tank is connected between the first flow path and the second pump, and the second heat exchanger is connected between the second pump and the first flow path, the second heat exchanger, the second tank, and the second pump are accommodated in the second case, and the temperature control system further includes a switcher that selectively connects the first circulation system and the second circulation system to the first flow path.

13. The plasma processing system according to claim 12, wherein the second heat exchanger is a condenser.

14. The plasma processing system according to claim 12, wherein the second segment further includes:

a third heat exchanger configured to exchange heat with a third temperature-controlled medium, and a third tank and a third pump in a third circulation system including the third heat exchanger and the third circulation system is configured to circulate the third temperature-controlled medium through a second flow path in a second member of the plasma processing apparatus, the third tank is connected between the second flow path and the third pump, and the third heat exchanger is connected between the third pump and the second flow path, and the third heat exchanger, the third tank, and the third pump are accommodated in the second case.

15. The plasma processing system according to claim 10, wherein the second segment further includes:

a second heat exchanger configured to exchange heat with a second temperature-controlled medium, and a second tank and a second pump in a second circulation system including the second heat exchanger and the second circulation system is configured to circulate the second temperature-controlled medium through a second flow path in a second member of the plasma processing apparatus, the second tank is connected between the second flow path and the second pump, and the second heat exchanger is connected between the second pump and the second flow path, and the second heat exchanger, the second tank, and the second pump are accommodated in the second case.

16. The plasma processing system according to claim 14, wherein the plasma processing apparatus is a capacitively-coupled plasma processing apparatus, and the second member is an upper electrode of the plasma processing apparatus.

17. The plasma processing system according to claim 10, wherein the first member is a substrate support of the plasma processing apparatus.

18. The plasma processing system according to claim 10, wherein the first segment is disposed below a floor on which the second segment is disposed.

19. The plasma processing system according to claim 12, wherein the first member is a substrate support of the plasma processing apparatus.

20. The plasma processing system according to claim 12, wherein the first segment is disposed below a floor on which the second segment is disposed.

* * * * *